US011042180B1

United States Patent
Lowe et al.

(10) Patent No.: US 11,042,180 B1
(45) Date of Patent: Jun. 22, 2021

(54) DETECTING IRREGULARITIES IN AN INPUT CLOCK SIGNAL

(71) Applicant: Arm Limited, Cambridge (GB)

(72) Inventors: Ivan Michael Lowe, Cedar Park, TX (US); Mikael Yves Marie Rien, Bernin (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/825,027

(22) Filed: Mar. 20, 2020

(51) Int. Cl.
*G06F 1/06* (2006.01)
*H03L 7/181* (2006.01)
*G06F 1/08* (2006.01)

(52) U.S. Cl.
CPC ............... *G06F 1/06* (2013.01); *G06F 1/08* (2013.01); *H03L 7/181* (2013.01)

(58) Field of Classification Search
CPC ..... G06F 1/06; G06F 1/08; G06F 1/10; G06F 1/14; H03L 7/181
See application file for complete search history.

(56) References Cited

U.S. PATENT DOCUMENTS 5,389,826 A * 2/1995 Sonobe ............... G06F 1/08
307/125

* cited by examiner

*Primary Examiner* — Jung Kim
(74) *Attorney, Agent, or Firm* — Nixon & Vanderhye P.C.

(57) ABSTRACT

An apparatus has an input interface for receiving an input clock signal, and a plurality N of clock divider circuits, each clock divider circuit generating a corresponding monitored clock signal by dividing the input clock signal by N. Each clock divider circuit is arranged, when generating a leading edge of each clock cycle of its corresponding monitored clock signal, to use a leading edge of a different clock cycle of the input clock signal to the clock cycle of the input clock signal used by any other of the clock divider circuits. Analysis circuitry provided in association with each clock divider circuit produces a width indication for each clock cycle of the corresponding monitored clock signal. Alarm generation circuitry then triggers an alarm signal when, for any of the monitored clock signals, a variation in the width indication is detected over multiple clock cycles of that monitored clock signal.

15 Claims, 12 Drawing Sheets

US 11,042,180 B1

DETECTING IRREGULARITIES IN AN INPUT CLOCK SIGNAL

BACKGROUND

The present technique relates to an apparatus and method for detecting irregularities in an input clock signal.

Such irregularities can arise for a number of reasons. As an example, it may be that an attacker seeks to modify a clock signal used within a data processing system, so as to seek to alter the intended behaviour of the data processing system. For instance, an attacker may seek to alter the clock frequency or introduce small pulse glitches into the clock signal. In addition, an attacker may seek to modify one or more clock edges of the clock signal, for example to introduce a localised change in frequency within the clock signal, or to change the duty cycle of the clock signal for one or more clock periods.

It is becoming more and more important to provide techniques that can be used to detect any attempt to tamper with a data processing system, and hence, in the context of clock signal tampering, to reliably detect any tampering with the intended clock signal. However, it is also desirable for any circuitry added within the data processing system to perform such tamper monitoring to occupy a small area and consume relatively little power, as it is desirable for such tamper monitoring circuitry not to contribute significantly to the cost, complexity, or power consumption of the data processing system in which it is used.

SUMMARY

In one example arrangement, there is provided an apparatus comprising: an input interface to receive an input clock signal; a plurality N of clock divider circuits, where each clock divider circuit is arranged to generate a corresponding monitored clock signal by dividing the input clock signal by N; wherein each clock divider circuit is arranged, when generating a leading edge of each clock cycle of its corresponding monitored clock signal, to use a leading edge of a different clock cycle of the input clock signal to the clock cycle of the input clock signal used by any other of the clock divider circuits to generate the leading edge of each clock cycle of their corresponding monitored clock signals; analysis circuitry provided in association with each clock divider circuit to produce a width indication for each clock cycle of the corresponding monitored clock signal; and alarm generation circuitry to trigger an alarm signal when, for any of the monitored clock signals, a variation in the width indication is detected over multiple clock cycles of that monitored clock signal.

In another example arrangement, there is provided a method of detecting irregularities in an input clock signal, comprising: employing a plurality N of clock divider circuits to generate N monitored clock signals, where each clock divider circuit generates its corresponding monitored clock signal by dividing the input clock signal by N; arranging each clock divider circuit, when generating a leading edge of each clock cycle of its corresponding monitored clock signal, to use a leading edge of a different clock cycle of the input clock signal to the clock cycle of the input clock signal used by any other of the clock divider circuits to generate the leading edge of each clock cycle of their corresponding monitored clock signals; producing, for each clock divider circuit, a width indication for each clock cycle of the corresponding monitored clock signal; and triggering an alarm signal when, for any of the monitored clock signals, a variation in the width indication is detected over multiple clock cycles of that monitored clock signal.

In a still further example arrangement, there is provided an apparatus comprising: input interface means for receiving an input clock signal; a plurality N of clock divider means, each clock divider means for generating a corresponding monitored clock signal by dividing the input clock signal by N; wherein each clock divider means is arranged, when generating a leading edge of each clock cycle of its corresponding monitored clock signal, to use a leading edge of a different clock cycle of the input clock signal to the clock cycle of the input clock signal used by any other of the clock divider circuits to generate the leading edge of each clock cycle of their corresponding monitored clock signals; analysis means provided in association with each clock divider circuit, for producing a width indication for each clock cycle of the corresponding monitored clock signal; and alarm generation means for triggering an alarm signal when, for any of the monitored clock signals, a variation in the width indication is detected over multiple clock cycles of that monitored clock signal.

BRIEF DESCRIPTION OF THE DRAWINGS

The present technique will be described further, by way of illustration only, with reference to examples thereof as illustrated in the accompanying drawings, in which.

DESCRIPTION OF EXAMPLES

Figure 1:
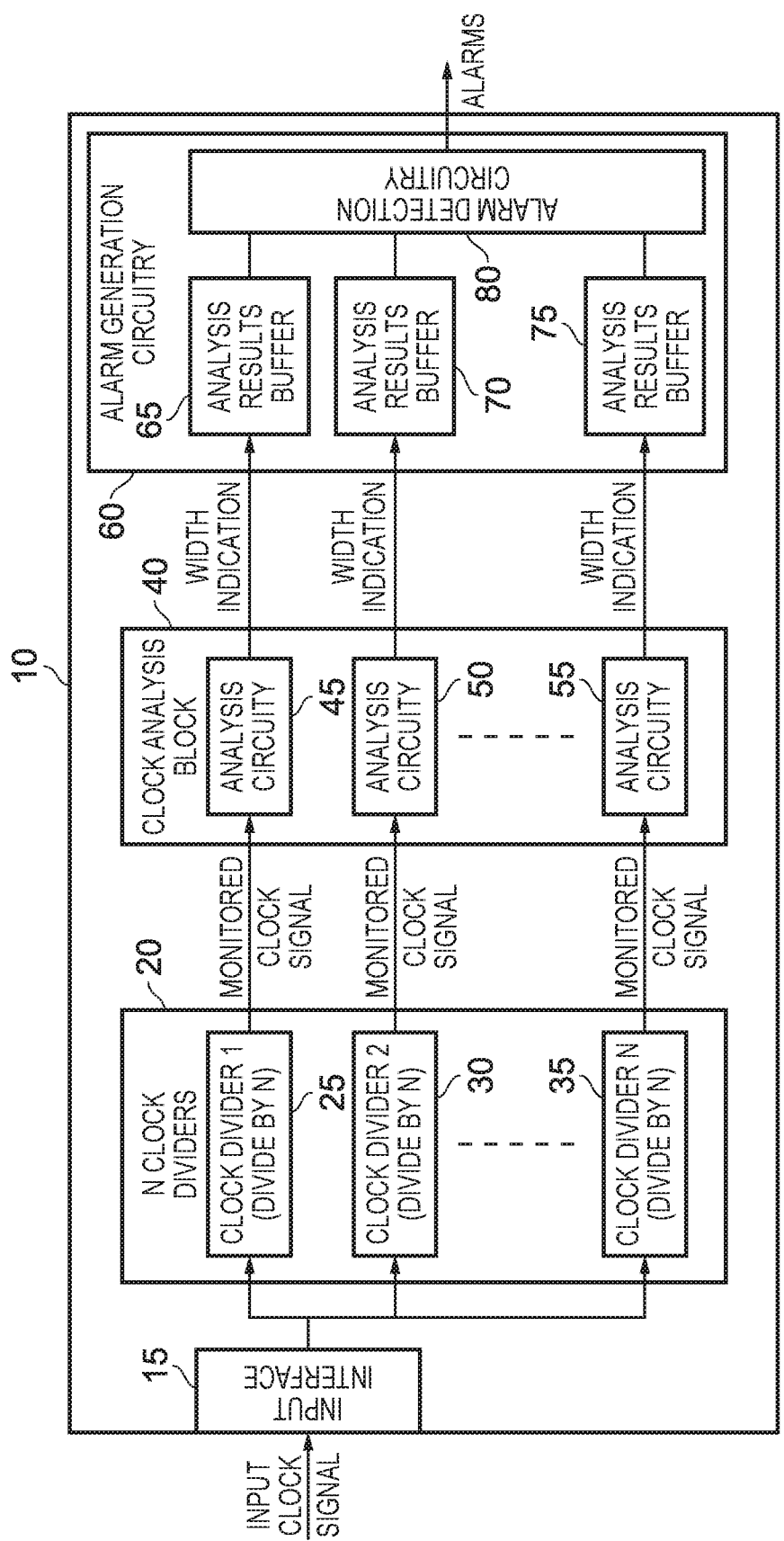
FIG. 1 is a block diagram of an apparatus that can be used in one example implementation to detect irregularities in an input clock signal.

In accordance with the techniques described herein, an apparatus is provided for monitoring an input clock signal in order to detect irregularities in that input clock signal. The input clock signal can take a variety of forms, and could for example be a system clock used by a data processing system in which the apparatus is incorporated. The apparatus can be used to detect various forms of irregularity in the input clock signal, and in one example implementation is used to seek to detect tampering with the input clock signal, enabling an alarm to be raised upon detecting an irregularity in the input clock signal that could be a result of such tampering.

The apparatus has an input interface for receiving the input clock signal, and a plurality N of clock divider circuits. Each clock divider circuit is arranged to generate a corresponding monitored clock signal by dividing the input clock signal by N. However, how the individual clock divider circuits reference the input clock signal when generating their corresponding monitored clock signals differs between each of the clock divider circuits. In particular, each clock divider circuit is arranged, when generating a leading edge of each clock cycle of its corresponding monitored clock signal, to use a leading edge of a different clock cycle of the input clock signal to the clock cycle of the input clock signal that is used by any of the other clock divider circuits when generating the leading edge of each clock cycle of their corresponding monitored clock signals.

Analysis circuitry is then provided in association with each clock divider circuit to produce a width indication for each clock cycle of the corresponding monitored clock signal. Since each of the N corresponding monitored clock signals have had the leading edge of their clock cycles driven by the leading edge of different clock cycles in the input clock signal, then any modification to such an edge of the input clock signal may manifest itself in a change to the width indication of the associated corresponding monitored clock signal.

The apparatus then further provides alarm generation circuitry that triggers an alarm signal when, for any of the monitored clock signals, a variation in the width indication is detected over multiple clock cycles of that monitored clock signal.

It has been found that such an approach provides a very efficient and reliable mechanism for detecting changes in individual edges of the input clock signal, and hence can be used to detect a wide variety of different clock disturbances such as modifications to the frequency of the input clock signal for one or more cycles, the introduction of small glitches into the clock signal, etc.

The technique is particularly useful when the input clock signal is at a relatively high frequency, and hence detecting small variations in any particular edges of the input clock signal is difficult. Since the apparatus described herein generates monitored clock signals that result from dividing the input clock signal by N, then it is easier to detect changes in the clock edges of the monitored clock signals due to them being at a lower frequency. Further, since N such monitored clock signals are produced, each having the leading edge of its clock cycles driven by a different leading edge in the original input clock signal, this enables variations in individual clock edges in the input clock signal to be reliably detected. It has been found that the circuitry required to implement the individual clock divider circuits and analysis circuits can be implemented with low area and cost, and hence even with the provision of N replicated versions of those clock divider circuits and analysis circuits the overall apparatus occupies a small area and consumes relatively little power. The alarm generation circuitry can also be implemented in a very simple and efficient manner to compare the width indications produced for multiple cycles of each corresponding monitored clock signal and trigger an alarm when any variation in the width indication is detected for one or more of the monitored clock signals.

The width indication can be produced in a variety of ways, but in one example implementation is indicative of a width of a chosen phase of each clock cycle of the corresponding monitored clock signal. The chosen phase could for example be the up pulse phase of a clock cycle or the down pulse phase of a clock cycle.

The analysis circuitry provided in association with each clock divider circuit can take a variety of forms. In one example implementation, oscillator circuitry is provided to generate a reference clock signal, and the analysis circuitry provided in association with each clock divider circuit comprises counter circuitry. Such counter circuitry may produce, as the width indication for each clock cycle of the corresponding monitored clock signal, a count value indicating the number of clock cycles of the reference clock signal occurring within a chosen phase of that clock cycle. Since the original input clock signal is divided by N in order to produce each monitored clock signal, a reference clock signal can readily be provided that is of a sufficiently high frequency to enable multiple cycles of the reference clock signal to occur within the chosen phase of the monitored clock signal, and hence for count values of sufficient granularity to be produced to enable changes in the width of the chosen phase over multiple clock cycles of the monitored clock signal to be detected.

The oscillator circuitry can take the form of either a digital oscillator or an analogue oscillator, and is arranged to produce a reference clock signal of a desired precision, for example using trimming techniques if necessary.

Any suitable form of counter circuitry can be used that is capable of maintaining a count value at least equal to the maximum expected count value, taking into account the frequency of the reference clock signal and the maximum width of the chosen phase of the monitored clock signal that could occur. As an example, a barrel shifter circuit could be used to form the counter circuitry. However, in one particular example implementation, a binary coded decimal (BCD) counter is used. Use of a BCD counter can assist in keeping the overall size of the apparatus very low, a BCD counter providing a very compact counter circuit size for any particular granularity of counter. For example a BCD counter can represent 32 different count values within a 5-bit value, and requires only a small number of simple logic components to maintain the count value.

In one example implementation, the apparatus further comprises counter reset circuitry to reset the counter circuitry provided in association with each clock divider circuit every N clock cycles of the input clock signal.

Hence, by way of example, prior to the reset occurring, the current count value held in a counter circuit may be output to a buffer, and then the counter circuitry can be reset so that it can begin counting again for the next clock cycle of the monitored clock signal. Since each monitored clock signal is produced by dividing the input clock signal by N, it will be appreciated that by causing the counter reset circuitry to reset the counter every N clock cycles of the input clock signal, this causes the counter to be reset for every clock cycle of the monitored clock signal.

As will be apparent from the earlier discussion, each monitored clock signal is created from a different leading edge of the input clock signal, and hence the various counter circuits will be actively performing their counter function at different absolute points in time. Accordingly, in one example implementation, for each counter circuitry, the counter reset circuitry is arranged to control timing of assertion of the reset signal in dependence on timing of a leading edge of the clock cycles of the corresponding monitored clock signal generated by the associated clock divider circuit. Accordingly, the actions of the counter reset circuitry are tailored to the individual counter circuits, so as to take account of the relative timing of the various monitored clock signals.

Whilst in the above example the analysis circuitry takes the form of counter circuitry, with the counter receiving a reference clock signal from oscillator circuitry to enable clock cycles of the reference clock signal to be counted during the chosen phase of the monitored clock signal, there is no requirement for the analysis circuitry to be configured in such a manner.

For example, in an alternative implementation, the oscillator circuitry is not used, and the analysis circuitry takes a different form. In particular, the analysis circuitry provided in association with each clock divider circuitry may comprise chain signals generation circuitry to generate, for each clock cycle of the corresponding monitored clock signal generated by the associated clock divider circuit, a set of chain signals encoding the width indication.

The chain signals generation circuitry can take a variety of forms, but in one example comprises a chain of registers that is configured to receive the corresponding monitored clock signal generated by the associated clock divider circuit, and to generate the set of chain signals in dependence on the corresponding monitored clock signal. In one example, each of the chain signals may be a single bit, and the value of the various chain signals within the set can be used to provide the width indication. In particular, due to the way in which the chain of registers are driven, then the output set of chain signals may comprise a first subset of chain signals having one value (e.g. a logic 0 value) followed by a second subset of chain signals having another value (e.g. a logic 1 value). In one particular example implementation, the width indication can be determined from the first subset of chain signals.

In addition to the chain of registers, in one example implementation the chain signals generation circuitry further comprises a chain of logic gates that is coupled to the chain of registers, and is used to control the value stored in each register. In particular, the chain of logic gates may be arranged to receive the corresponding monitored clock signal and to produce, for each register in the chain of registers, a delayed version of the monitored clock signal that is used to derive a reset signal applied to that register. Further, an amount of delay in the delayed version of the monitored clock signal is different for each register, and accordingly each register in the chain of reset registers is reset at a different point in time.

In one example implementation, an output value of each register is initialised to a first value at a start of each clock cycle of the corresponding monitored clock signal, and transitions to a second value when the reset signal is received at that register. The set of chain signals then comprises the output value of each register at the end of each clock cycle, and the width indication is provided by those chain signals at the second value. Due to the fact that each register in the chain has its reset signal driven by a more delayed version of the monitored clock signal, there will become a point in time where the reset signal has not been asserted for one or more of the later registers in the chain of registers by the time the chosen phase of the monitored clock signal has completed, and in that event the reset signal will not be asserted and those registers will retain their output at the first value. Hence, the number of chain signals in the set of chain signals whose value has transitioned to the second value gives an indication of the width of the chosen phase of the monitored clock signal.

The above-described apparatus can be used to monitor a chosen phase of each cycle of each monitored clock signal. If desired, the circuitry can be replicated so as to also monitor the other phase of each cycle of each monitored clock signal. In particular, in one example implementation the apparatus may further comprise inverter circuitry for generating an inverted version of the input clock signal. Replicated versions of the N clock divider circuits, analysis circuitry and alarm generation circuitry can then be provided, where the replicated versions of the N clock divider circuits are arranged to receive the inverted version of the input clock signal. As a result, for each monitored clock signal, the width indication produced by the associated analysis circuitry is indicative of a width of a first phase of a clock cycle of the monitored clock signal, and the width indication produced by the replicated version of the associated analysis circuitry is indicative of a width of a second phase of the clock cycle of that monitored clock signal. As a result, alarms can be detected from analysis of both the up pulse and the down pulse of the monitored clock signals, by using the replicated circuitry discussed above.

Further, by providing such replicated circuitry, it is also then possible to implement a duty cycle alarm detection technique. The duty cycle of a clock signal is the proportion of the clock period that the clock is in the active phase. Hence, if the up pulse is the active phase, it indicates the proportion of the clock period that the clock spends in the up pulse, as opposed to the down pulse. Whilst for some clock signals the up pulse and the down pulse are of an equal length, it will be appreciated that in other systems the lengths of the up pulse and the down pulse may be different. In any event, within a particular system, there will be an understanding of the expected duty cycle, and by using the above replicated circuitry, it is possible to detect variations from that expected duty cycle.

In particular, in one example implementation, duty cycle alarm generation circuitry is provided, that is arranged to receive a first width indication produced by the analysis circuitry for a chosen one of the clock divider circuits during a given clock cycle of the corresponding monitored clock signal. That duty cycle alarm generation circuitry also receives a second width indication produced by the replicated version of the analysis circuitry for the replicated version of the chosen one of the clock divider circuits during the same given clock cycle. The duty cycle alarm generation circuitry can then determine a duty cycle indication from a comparison of the first and second width indications, and can then generate a duty cycle alarm signal when the determined duty cycle differs from an expected duty cycle.

It should be noted that whilst there are N clock divider circuits and N replicated clock divider circuits, in one example implementation only one of the clock divider circuits and one of the replicated clock divider circuits needs to be considered when performing the duty cycle alarm monitoring functionality discussed above.

Particular examples will now be described with reference to the figures.

FIG. 1 is a block diagram of an apparatus used in one example implementation in order to detect irregularities in an input clock signal, for example irregularities that may be introduced by an attacker when seeking to alter a clock signal. The clock signal for which it is desired to detect tampering is provided as an input clock signal to the input interface 15 of the apparatus 10. The input clock signal can take a variety of forms but could, for example, be a system clock used by a system in which the apparatus 10 is incorporated.

Figure 2:
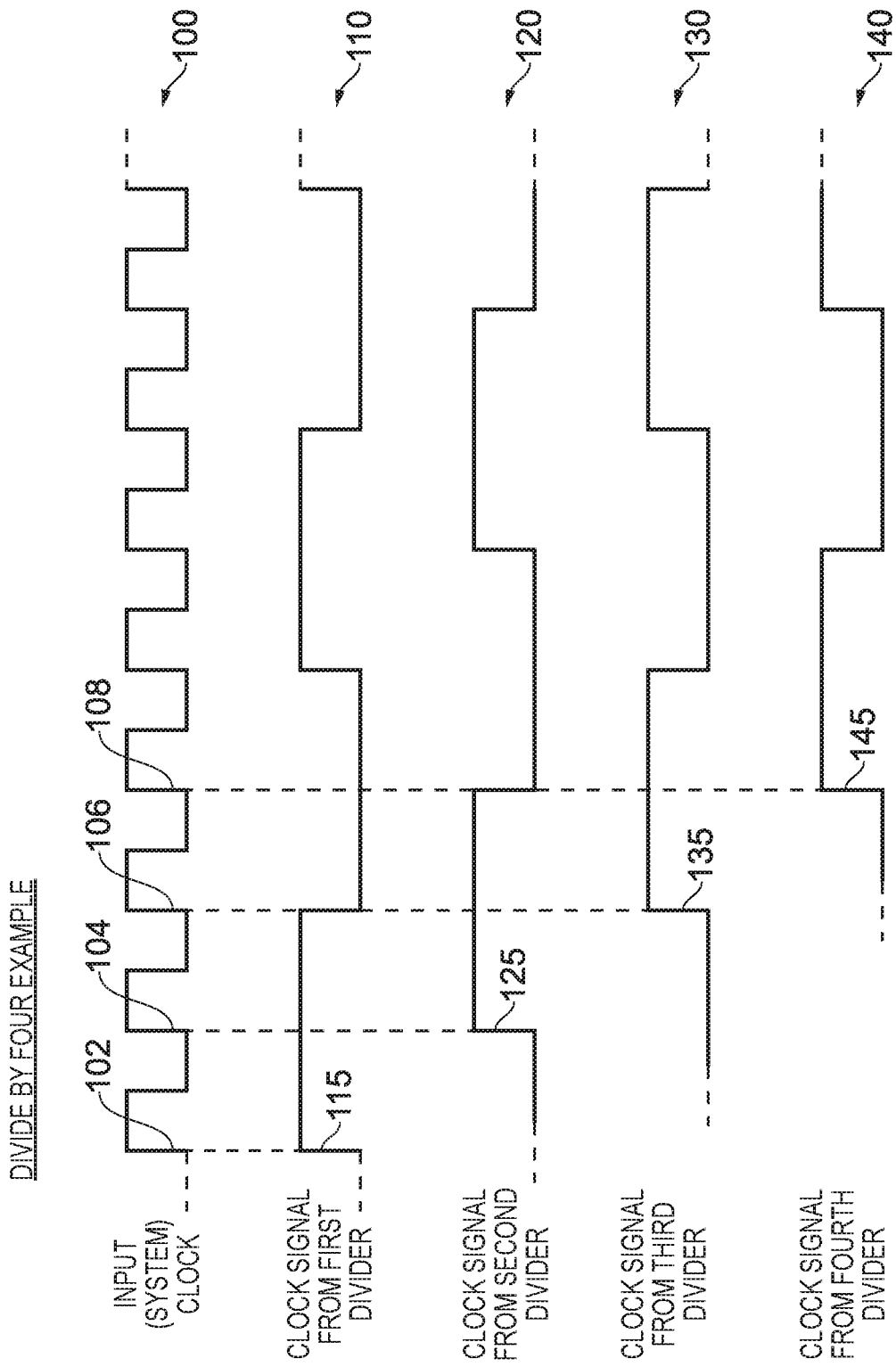
FIG. 2 schematically illustrates how the N monitored clock signals shown in FIG. 1 are derived from an input clock signal, in accordance with one example arrangement.

As shown in FIG. 1, the input clock signal is propagated from the input interface to N clock divider circuits 25, 30, 35, collectively referred to herein as the clock dividers 20. Each clock divider circuit is arranged to divide the input clock signal by N in order to produce a corresponding monitored clock signal. However, as shown in FIG. 2, each clock divider circuit 25, 30, 35 operates off a different leading edge of the input clock signal. Hence, in the example of FIG. 2, N is equal to 4, and accordingly there are four clock divider circuits, each of which divides the input clock signal 100 by 4 in order to produce the four monitored clock signals 110, 120, 130, 140. As shown in FIG. 2, different leading edges 102, 104, 106, 108 of the input clock signal 100 are used by each of the clock dividers.

Hence, when considering the monitored clock signal 110 produced by the first clock divider, a leading edge 115 of that monitored clock signal is generated from the leading edge 102 of the input clock signal. Similarly, for the monitored clock signal 120 the leading edge 125 of the monitored clock signal is generated from the leading edge 104 of the input clock signal, for the monitored clock signal 130 the leading edge 135 is generated from the leading edge 106 of the input clock signal 100, and for the monitored clock signal 140 the leading edge 145 is generated from the leading edge 108 of the input clock signal 100.

As shown in FIG. 1, each monitored clock signal produced by a clock divider circuit 25, 30, 35 is input to an associated analysis circuit 45, 50, 55, these various analysis circuits being referred to collectively herein as the clock analysis block 40. The analysis circuits 45, 50, 55 can take a variety of forms. For example, they may comprise counter circuits, such as will be discussed later with reference to the example implementation in FIG. 5, but in an alternative implementation may take the form of chain signals generation circuitry, as will be discussed later with reference to the example implementation of FIG. 7.

Each analysis circuit is arranged to analyse the received monitored clock signal, and to produce a width indication for each clock cycle of that monitored clock signal. The width indication can take a variety of forms, but in one example implementation is indicative of a width of a chosen phase of each clock cycle of the corresponding monitored clock signal, for example either the up pulse phase or the down pulse phase.

The various width indications produced by the analysis circuits within the clock analysis block 40 are provided to alarm generation circuitry 60. In one example implementation, this includes an analysis results buffer 65, 70, 75 used to capture the width indications output from a corresponding analysis circuit over two or more clock cycles of the monitored clock signal. That buffered information can then be provided to alarm detection circuitry 80 that is arranged to trigger an alarm signal when, for any of the monitored clock signals, a variation in the width indication is detected over multiple clock cycles of that monitored clock signal. In one example implementation, whenever such a variation is detected in at least one of the monitored clock signals, an alarm signal is generated by the alarm generation circuitry 60.

Figure 3:
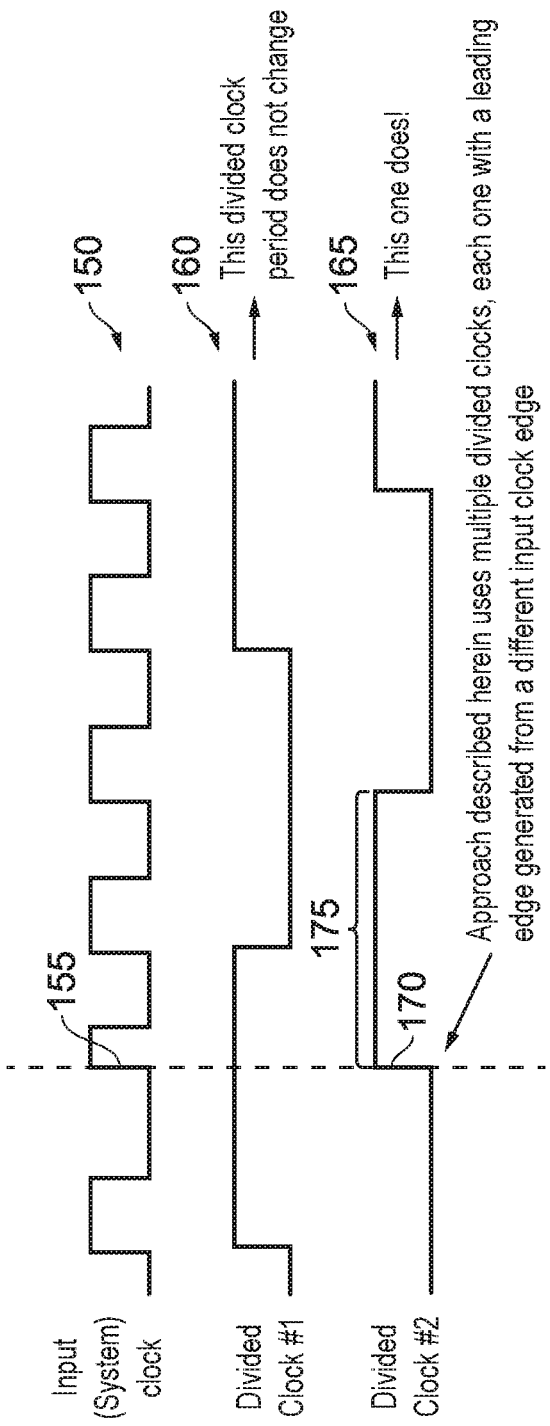
FIG. 3 illustrates how the technique shown in FIG. 2 can be utilised to detect modification in the timing of one of or more clock edges within the input clock signal.

FIG. 3 schematically illustrates how the use of N clock divider circuits that each divide the input clock signal by N, but are driven off a different leading edge of the input clock signal to each of the other clock divider circuits, can be used to detect tampering with an edge within the input clock signal. In particular, for the input clock signal 150, it is assumed that the edge 155 is moved. The monitored clock signal 160 produced by a first clock divider circuit would not detect this single rising edge manipulation in the input clock signal, but the monitored clock signal 165 would, since the rising edge 170 of that monitored clock signal is driven by the rising edge 155 of the input clock signal. Accordingly, the width indication of the up pulse 175 produced in the clock cycle driven from the leading edge 155 would differ from the width indication produced for the up pulse in an adjacent clock cycle of the monitored clock signal 165, and accordingly would be detected by the alarm generation circuitry 60.

Figure 4:
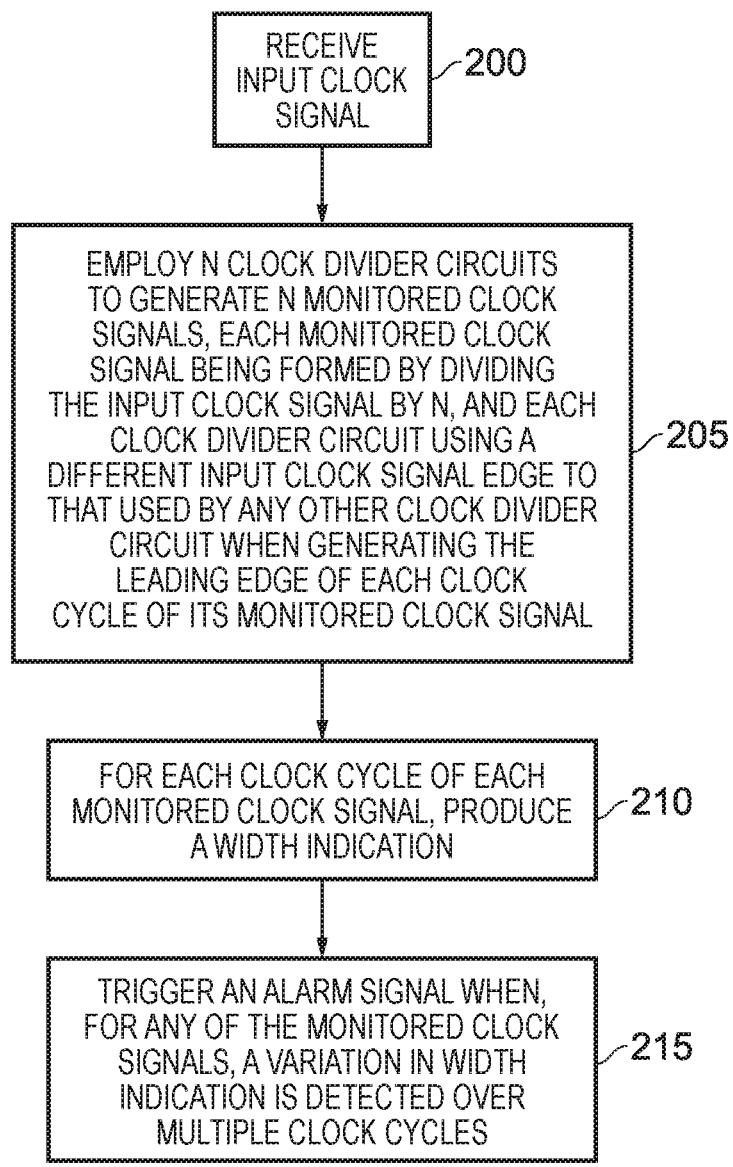
FIG. 4 is a flow diagram illustrating the operation of the apparatus of FIG. 1 in accordance with one example implementation.

FIG. 4 is a flow diagram illustrating the operation of the apparatus of FIG. 1 in one example implementation. At step 200, the input clock signal is received. At step 205 the N clock divider circuits 25, 30, 35 are used to generate N monitored clock signals. Each monitored clock signal is formed by dividing the input clock signal by N, and each clock divider circuit uses a different input clock signal edge to that used by any other clock divider circuit when generating the leading edge of each clock cycle of its monitored clock signal.

At step 210, for each clock cycle of each monitored clock signal, a width indication is produced by the clock analysis block 40. At step 215, an alarm signal is then triggered by the alarm generation circuitry 60 when, for any of the monitored clock signals, a variation in width indication is detected over multiple (i.e. two or more) clock cycles. As discussed earlier, the analysis results buffers 65, 70, 75 provided in association with each analysis circuit 45, 50, 55 can buffer the width indications produced by the associated analysis circuit for two or more previous clock cycles. Hence, by way of specific example, whilst an analysis circuit is producing a width indication for a current clock cycle of the monitored clock signal, the width indications produced for the two preceding clock cycles can be stored in the associated analysis results buffer and analysed in order to detect whether there is any difference in those two width indications. If so, the alarm detection circuitry 80 can generate an alarm.

Figure 5:
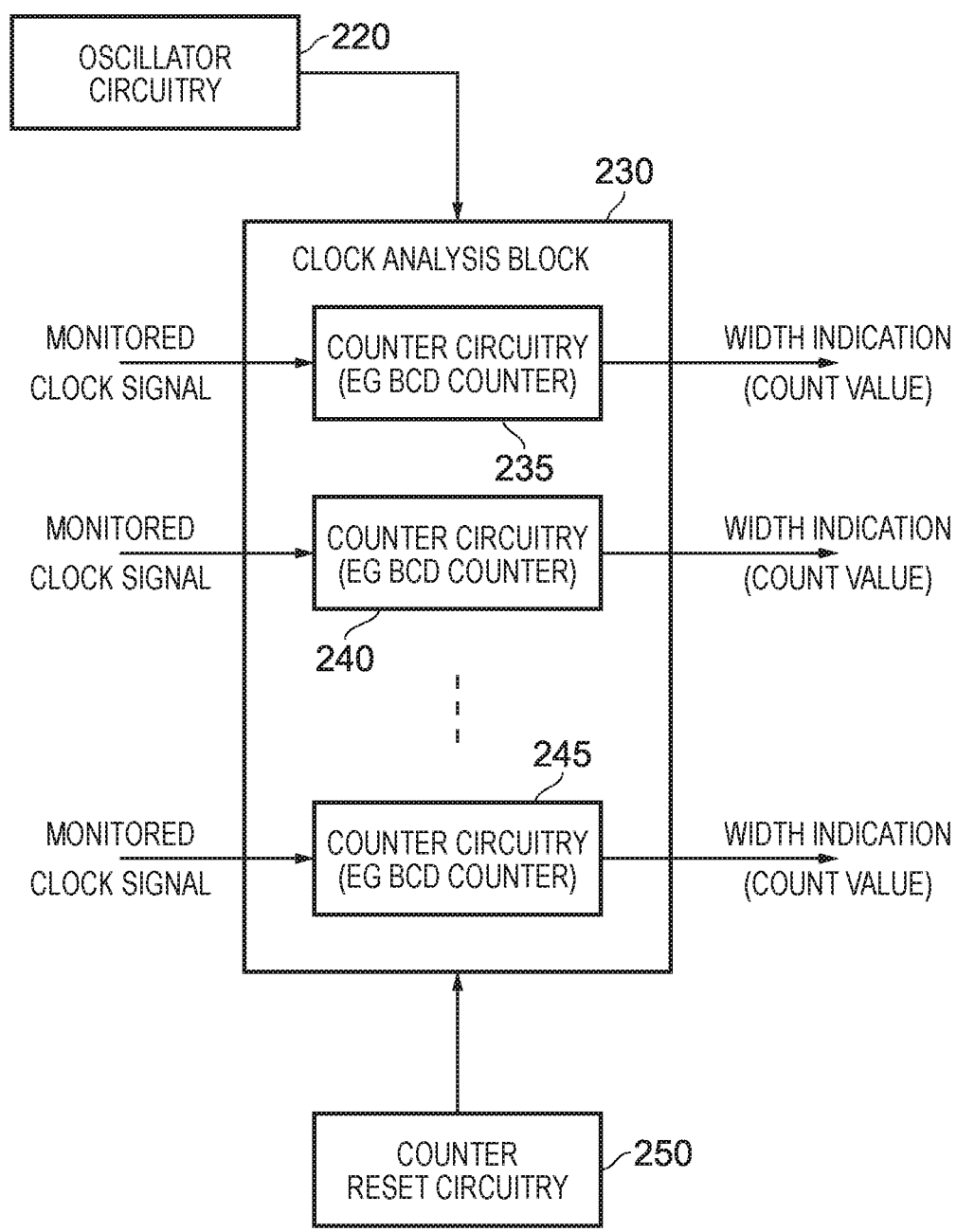
FIG. 5 is a block diagram illustrating one form of the clock analysis block shown in FIG. 1, along with associated oscillator circuitry and counter reset circuitry, in accordance with one example implementation.

FIG. 5 illustrates a form of the clock analysis block that may be used in one example implementation. In this case, each of the analysis circuits takes the form of counter circuitry. Hence, the clock analysis block 230 comprises N counter circuits 235, 240, 245, each counter circuit receiving the monitored clock signal produced by an associated clock divider circuit 25, 30, 35.

Each counter circuit also receives a reference clock signal output by oscillator circuitry 220, the reference clock signal having a higher clock frequency than the clock frequency of the monitored clock signals. This can readily be achieved since, as discussed earlier, each of the monitored clock signals is produced by dividing the input clock signal by N, and hence the monitored clock signals are of a relatively low frequency. The oscillator circuit can be formed in a variety of ways and hence, for example, could be a digital oscillator or an analogue oscillator. In order to produce a reference clock signal of a desired precision, trimming techniques may be used if necessary.

Each counter circuit 235, 240, 245 is arranged to produce, as a width indication for each clock cycle of the corresponding monitored clock signal, a count value indicating the number of clock cycles of the reference clock signal occurring within a chosen phase of that clock cycle of the monitored clock signal. As mentioned earlier, the chosen phase may be the up pulse phase or the down pulse phase in one example implementation.

The counter circuitry can take a variety of forms, but given that the counter circuitry is replicated N times it is desirable to use an efficient counter design. A suitable counter design is a binary coded decimal (BCD) counter, which requires only a small number of simple logic components to maintain a count value, and provides a very compact size for a chosen granularity of counter.

After each clock cycle of the associated monitored clock signal, the counter circuitry is reset. At that point, the current value of the counter is output as the width indication to the associated analysis results buffer, and the counter circuitry is reset to 0 to begin counting the number of clock cycles of the reference signal appearing during the chosen phase of the next clock cycle of the monitored clock signal. To perform this resetting function, counter reset circuitry 250 can be provided, the counter reset circuitry being arranged in one example implementation to be able to generate individual reset signals for each of the counter circuits 235, 240, 245. As will be apparent from the earlier discussed FIG. 2, the monitored clock signals are staggered in time, and hence the activities of the associated counter circuits are staggered in time. The reset signal generated by the counter reset circuitry is hence asserted at different points in time for the different counter circuits. In particular, the actions of the counter reset circuitry are tailored to the individual counter circuits, so as to take account of the relative timing of the various monitored clock signals, in order to ensure that each counter circuit is reset at the end of the clock cycle of its associated monitored clock signal.

Figure 6:
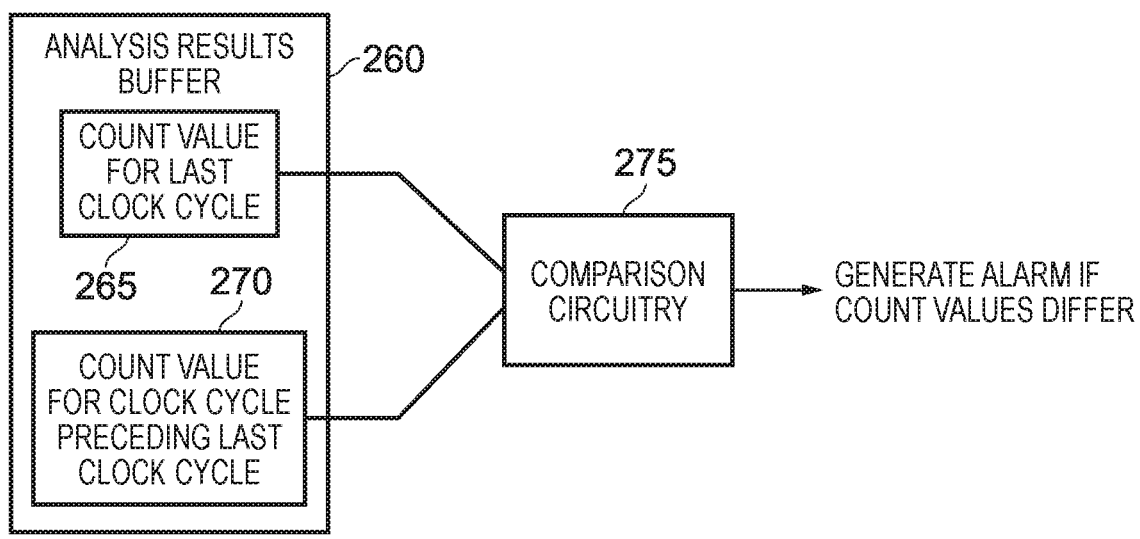
FIG. 6 illustrates one example form of the analysis results buffer when using the counters shown in FIG. 5, in accordance with one example implementation.

FIG. 6 shows an analysis results buffer 260 that can be provided in association with each counter circuit 235, 240, 245 in order to buffer the width indications produced by that associated counter circuit over multiple clock cycles of the monitored clock signal. In the particular example shown in FIG. 6, the analysis results buffer comprises two storage elements 265, 270 to store the count value produced as the width indication for both the last clock cycle and for the clock cycle preceding the last clock cycle. Those count values can then be provided to comparison circuitry 275 forming part of the alarm detection circuitry 80, in order to cause an alarm to be generated if those count values differ.

The circuitry of FIG. 6 can be replicated for each monitored clock signal, with N separate alarm signals being generated. If desired, those multiple alarm signals can then be logically combined together, for example using an OR function in situations where the asserted state of the alarm is indicated by a logic 1 value, in order to generate a combined alarm signal which will be asserted whenever any one of the individual alarm signals is asserted.

Figure 7:
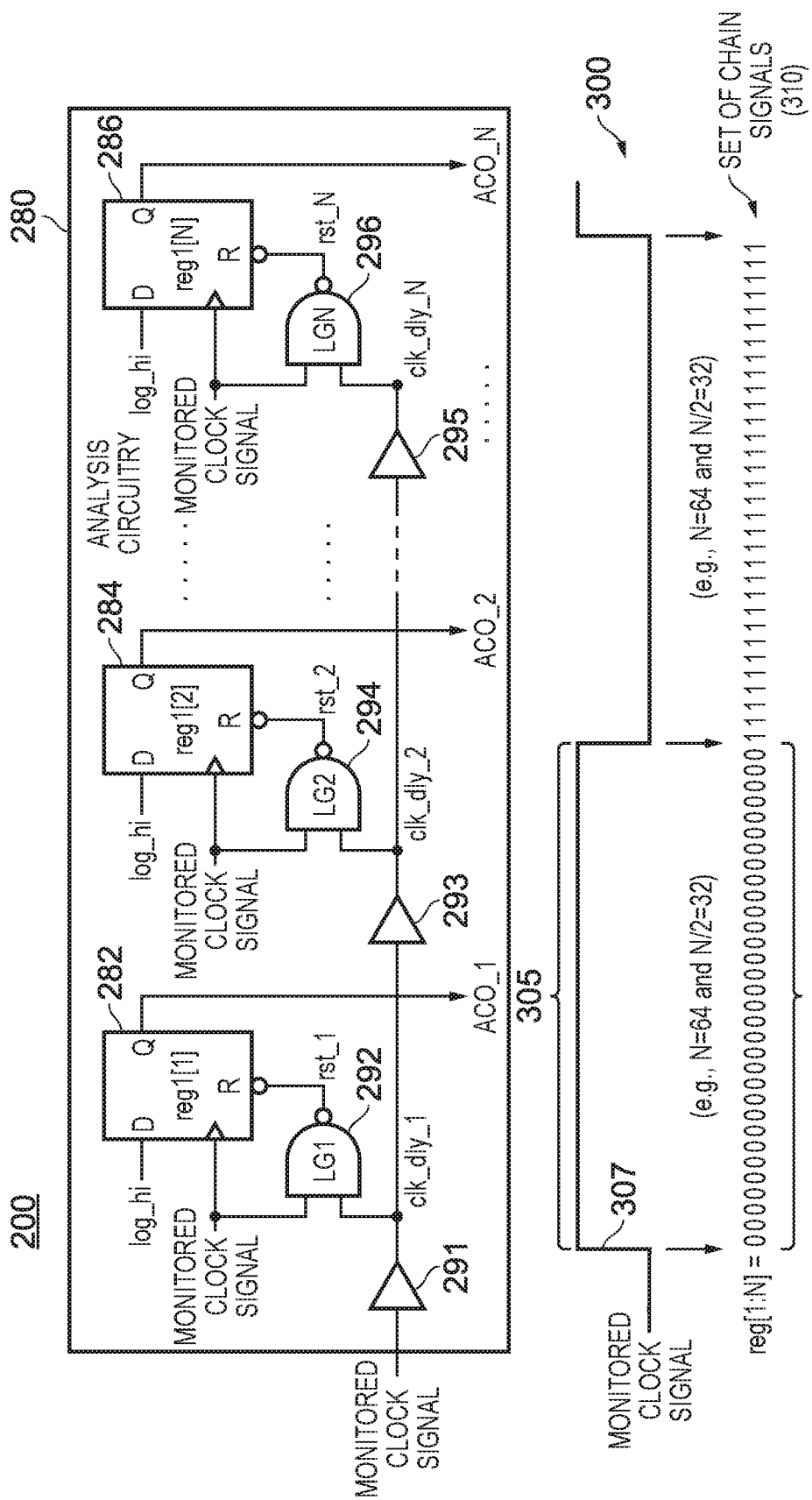
FIG. 7 illustrates an alternative form of analysis circuitry that can be used in one example implementation.

Whilst in the example of FIGS. 5 and 6 the analysis circuitry takes the form of counter circuitry, this is not a requirement, and in an alternative implementation a different form of analysis circuitry can be used. FIG. 7 illustrates a form of analysis circuitry 280 referred to herein as chain signals generation circuitry. For each clock cycle of the corresponding monitored clock signal, the chain signals generation circuitry is arranged to generate a set of chain signals 310 that encodes the width indication of a chosen phase 305 (in this example the up pulse) of the monitored clock signal 300.

As shown in FIG. 7, the chain signals generation circuitry comprises a chain of registers 282, 284, 286 that are each configured to receive the monitored clock signal generated by the associated clock divider circuit, and which output the set of chain signals in dependence upon the corresponding monitored clock signal.

As also shown in FIG. 7, the chain signals generation circuitry 280 includes a chain of logic gates 291, 292, 293, 294, 295, 296 that also receive the monitored clock signal, but generate a delayed version of that monitored clock signal that is used to derive a reset signal applied to each register. The amount of delay in the delayed version of the monitored clock signal is different for each register.

When the monitored clock signal enters the active phase of the clock cycle on the rising edge 307, then each of the registers 282, 284, 286 is arranged to output from its Q output the input value provided at the D input, which in this case is a logic high value. Accordingly, at point 307, each of the registers outputs a logic 1 value. During the active phase 305 of the monitored clock signal 300, the upper input of each NAND gate 292, 294, 296 is set to a logic 1 value. However, the lower input of each NAND gate only transitions to the logic 1 value at a later point in time, dependent on the cumulative delay introduced by the delay elements 291, 293, 295. As will be apparent from FIG. 7, the NAND gate 292 will be the first to have both of its inputs received at a logic 1 value, which will cause it to output a logic 0 value that is then inverted to produce the reset input to the associated register 282. At this point, the reset is asserted, causing the Q output from the register 282 to transition to a logic 0 value.

This process continues down through the chain of registers for the entire time of the active phase 305 of the monitored clock signal 300, such that by the time the active phase ends, a certain number of the registers will have transitioned their output to a logic 0 value, due to having received an asserted reset, whilst the remaining registers will not. During the inactive phase of the monitored clock signal, no resets will be asserted, since the upper input of each NAND gate will be at a logic 0 value, and accordingly irrespective of the value of the other input each NAND gate will produce a logic 1 output, which will cause a logic 0 value to be received at the reset pin.

Accordingly, at the end of the clock cycle of the monitored clock signal 300, the set of chain signals 310 will take the form shown in FIG. 7, where a first subset of the chain signals have a logic 0 value, providing the width indication, whilst the second subset of the chain signals have a logic 1 value.

In FIG. 7, it will be seen that the set of chain signals are referred to by the combination of the signal lines AC0_1, AC0_2, . . . , AC0_N. Further, whilst the registers 282, 284, 286 may be implemented in a variety of ways, in the example of FIG. 7 each of the registers is arranged as a D flip-flop.

Figure 8A:
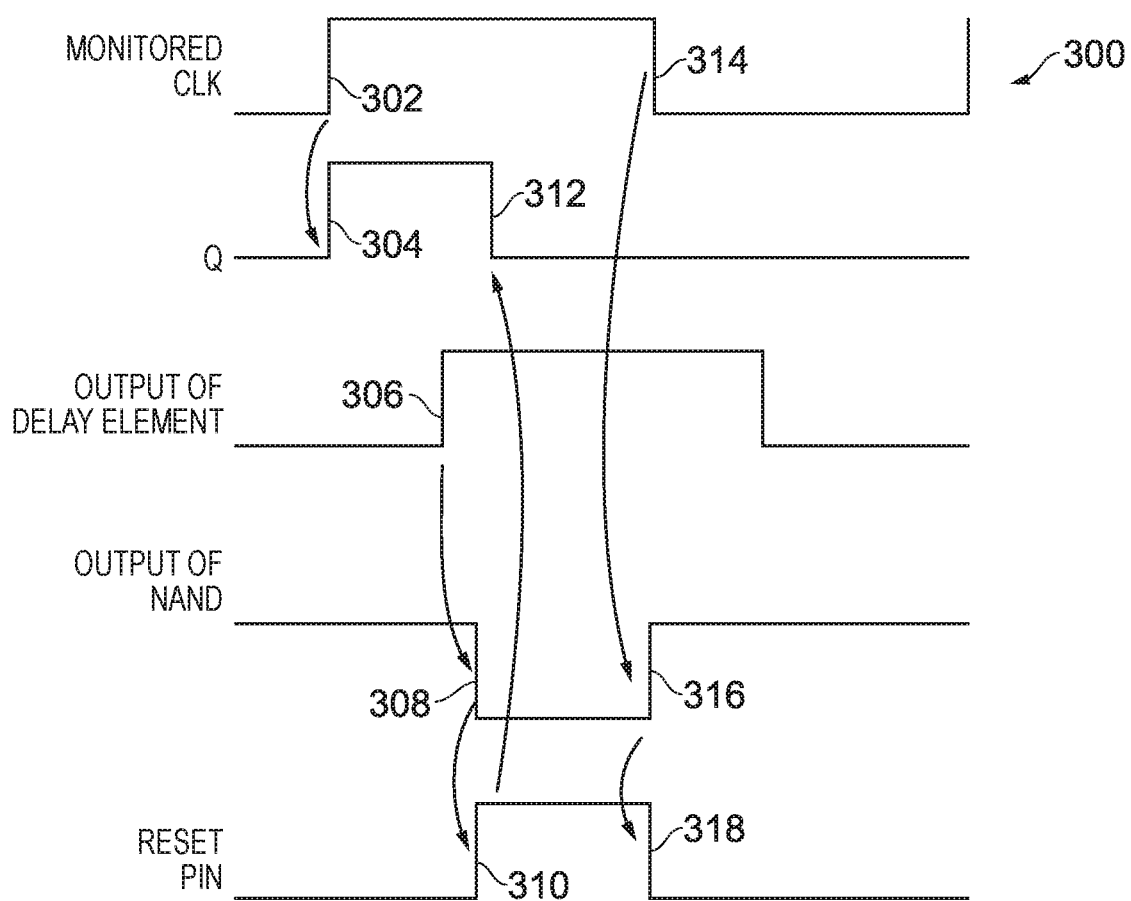
FIGS. 8A and 8B are timing diagrams used to illustrate the operation of the registers and logic gates of the analysis circuitry of FIG. 7, in accordance with one example implementation.
Figure 8B:
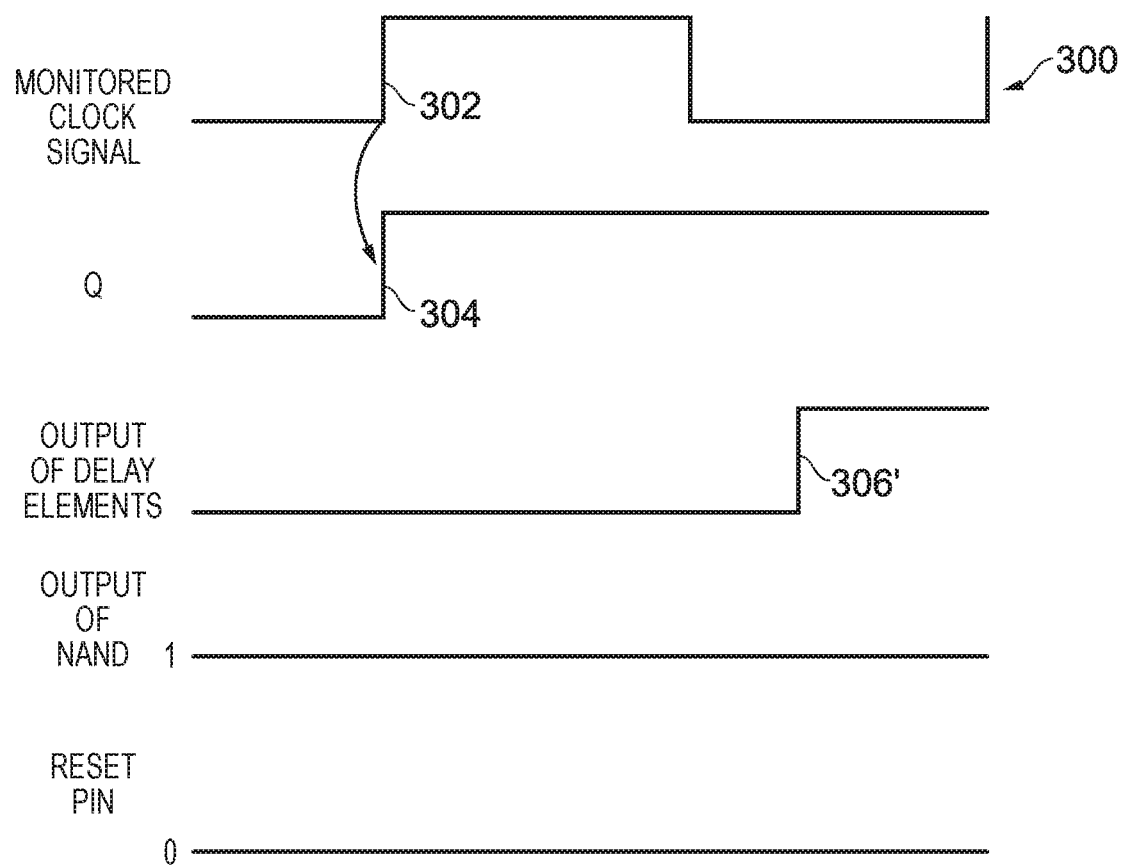

FIGS. 8A and 8B are timing diagrams illustrating the operation of the circuitry of FIG. 7. Firstly, FIG. 8A illustrates a timing diagram for a register and associated logic gates appearing at a point in the chain where the active phase of the delayed monitored clock signal is received by the relevant NAND gate during the active phase 305 of the monitored clock signal, and accordingly causes the output of the register to transition to a logic 0 value. As shown in FIG. 8A, on the rising edge 302 of the monitored clock signal 300, the Q output of the register transitions to a logic 1 value, as indicated by the edge 304. When the output of the associated delay element (for example the delay element 291 when considering the register 282) transitions to a logic 1 value at point 306, this causes both inputs to be NAND gate to be at a logic 1 value, hence causing the output of the NAND gate to transition to a logic 0 value, as indicated by the transition 308. This in turn causes the reset pin of the register to be asserted, as indicated by the transition 310, and hence causes the Q output of the register to transition to a logic 0 value, as indicated by the edge 312.

When the active phase of the monitored clock signal 300 ends, as indicated by the edge 314, then the upper input of the NAND gate transitions to a logic 0 value, which causes the output of the NAND gate to transition to a logic 1 level, as indicated by the edge 316, and this in turn causes de-assertion of the reset as indicated by the edge 318. However, at this point the Q output is maintained at a logic 0 value, since it will only transition back to a logic 1 value on the next rising edge of the monitored clock signal.

FIG. 8B is a timing diagram for a register in the chain that is not reset during the active phase 305 of the monitored clock signal 300, due to the cumulative delay introduced by the delay elements 291, 293, 295 causing a reset not to be asserted. As shown in FIG. 8B, in the same way as discussed earlier with reference to FIG. 8A, on the rising edge 302 of a clock cycle of the monitored clock signal 300, the Q output from the register transitions to a logic 1 value, as indicated by the edge 304. In this instance, it is assumed that the output of the delay elements causes the delayed monitored clock signal to only transition high at the point 306', and at this point the monitored clock signal is in the inactive phase. Accordingly, the transitioning high of the delayed monitored clock signal at point 306' does not cause any change in the output of the NAND gate. As a result, the output of the NAND gate stays at the logic 1 value for the whole clock period as at no point in time is both the monitored clock signal and the output of the relevant delay element at a logic high level. Accordingly, the reset is not asserted.

Figure 9:
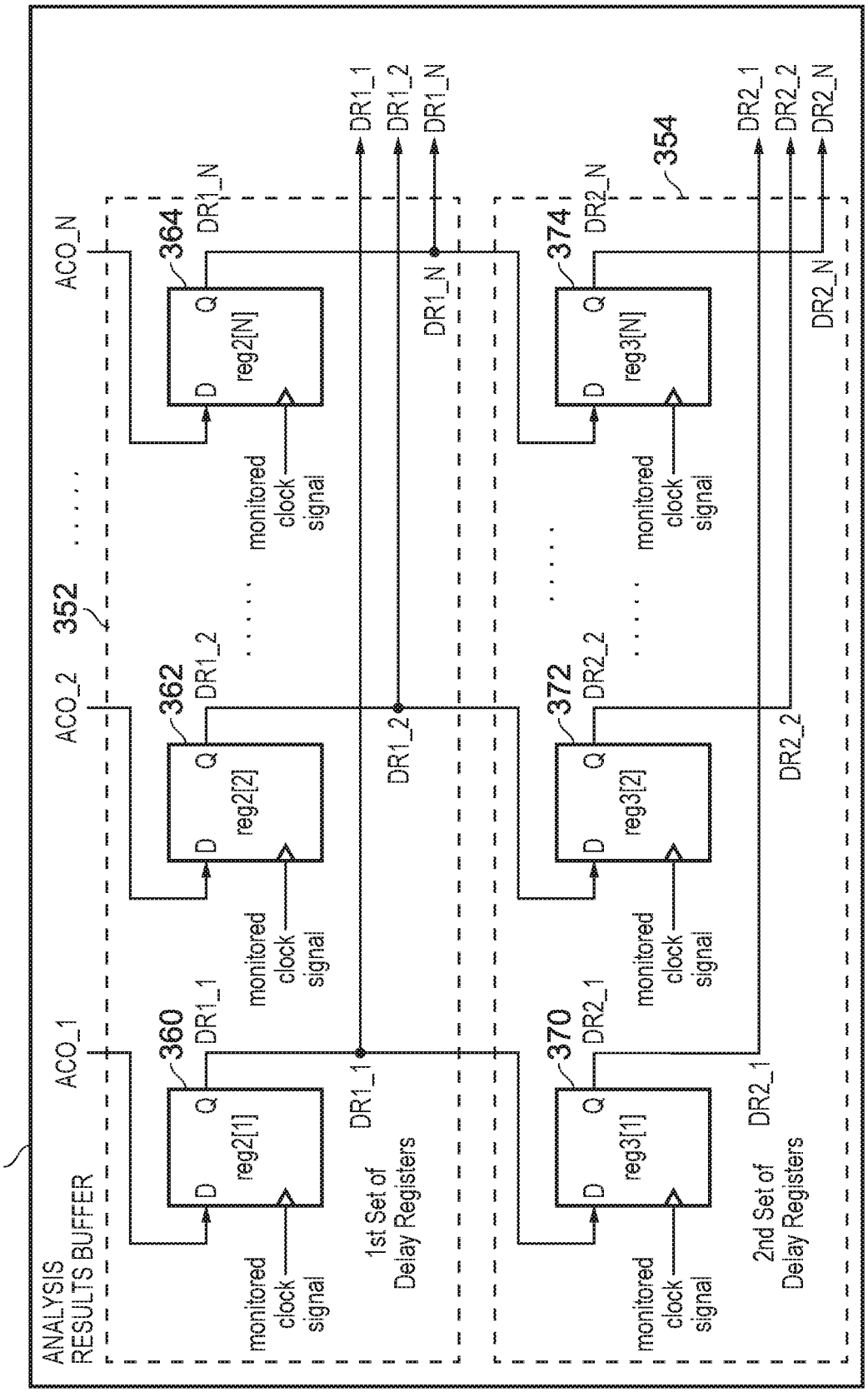
FIG. 9 illustrates one example format of the analysis results buffer when utilising the analysis circuitry of FIG. 7, in accordance with one example implementation.

FIG. 9 illustrates a form of the analysis results buffer 350 that can be used when using the chain signals generation circuitry of FIG. 7 as the analysis circuitry. As shown in FIG. 9, the analysis results buffer 350 is formed of two sets of delay registers 352, 354. The first set of delay registers 352 comprises a chain of registers 360, 362, 364 that receive at their inputs corresponding chain signals from the set of chain signals output by the chain signals generation circuitry 280. On the rising edge of the monitored clock signal, each register outputs from its Q output the chain signal received at its D input from the analysis circuitry 280.

The output from the first set of delay registers 352 is provided as an input to corresponding registers 370, 372, 374 in a second set of delay registers 354, which operates in the same way discussed above for the first set of chain registers. Hence, on the rising edge of the monitored clock signal, each of the registers 370, 372, 374 outputs the value provided at its D input.

Figure 10:
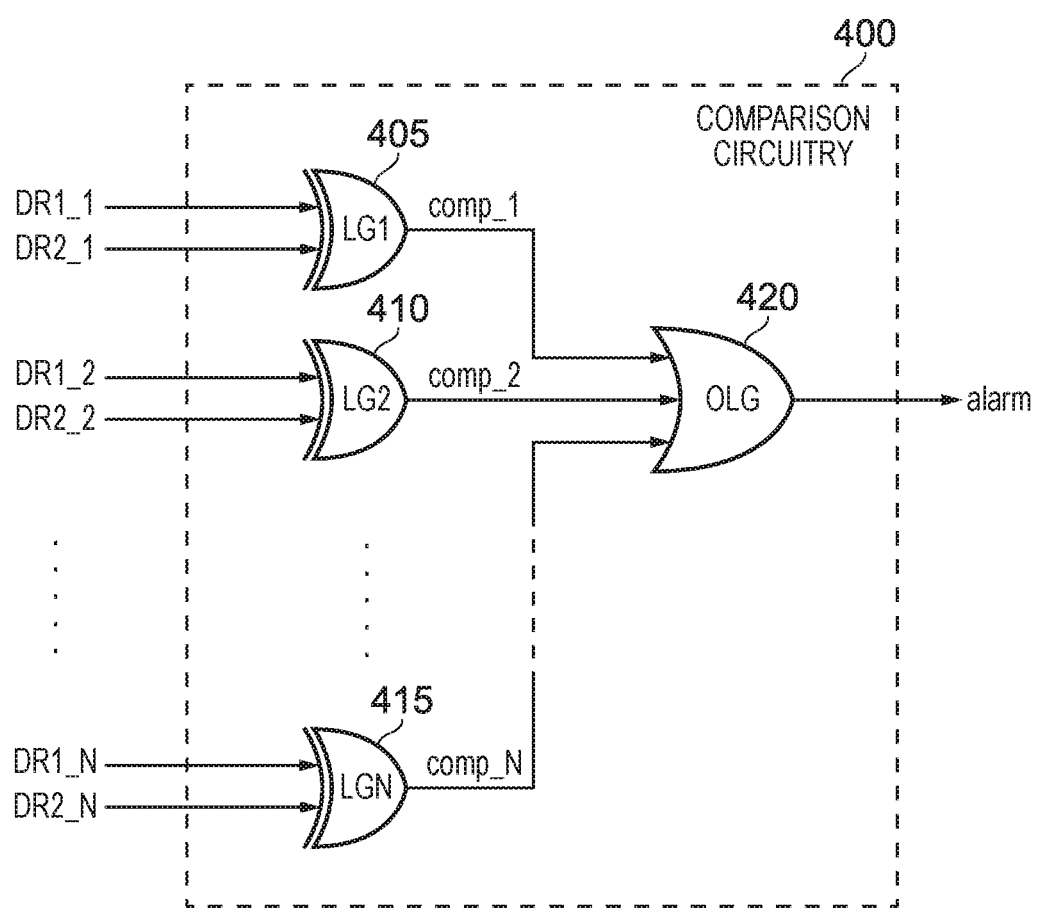
FIG. 10 illustrates comparison circuitry that can be used within the alarm generation circuitry in order to detect an alarm condition from the content stored in the analysis results buffer of FIG. 9, in accordance with one example implementation.

As a result, it can be seen that at the start of each clock cycle of the monitored clock signal, the analysis results buffer 350 stores the set of chain signals produced for the preceding two clock cycles. The outputs from each set of delay registers 352, 354 can then be provided to comparison circuitry, which in one example implementation can take the form shown in FIG. 10. In particular, FIG. 10 shows the comparison circuitry 400 that may be provided in association with one instance of the analysis results buffer. As shown, each bit output from a register in the first set of delay registers 352 can be compared with the bit output by a corresponding register in the second set of delay registers 354, using the XOR gates 405, 410, 415. As will be well understood, an XOR gate will produce a logic 1 output when its inputs differ, and accordingly each of the outputs from the XOR gates 405, 410, 415 can be passed through a logic OR function 420 in order to produce an alarm signal which will be asserted at a logic 1 value when any difference is detected by any of the XOR gates 405, 410, 415.

As discussed earlier with reference to FIG. 6 the alarm signal generated by each of the comparison circuits 400 can then be logically combined if desired, in order to produce a global alarm signal based on the width indications produced by each of the N analysis circuits.

Figure 11:
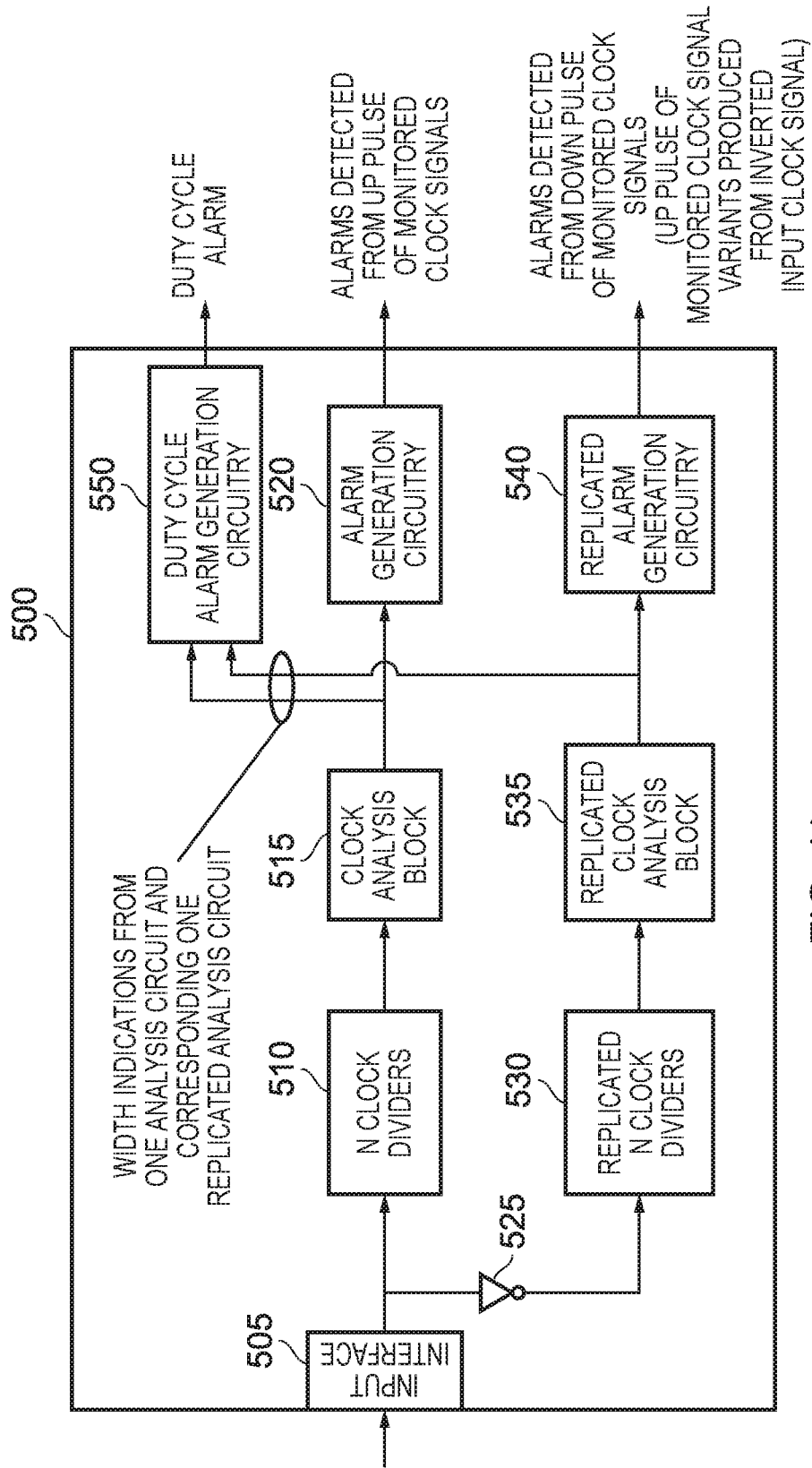
FIG. 11 illustrates an apparatus in accordance with an alternative example implementation.

As discussed earlier, the circuitry described thus far can be used to monitor a chosen phase of each clock cycle of each monitored clock signal. If desired, the circuitry can be replicated so as to also monitor the other phase of each clock cycle of each monitored clock signal. This is indicated in FIG. 11, for the apparatus 500. In this example, the interface circuitry 505, N clock dividers 510, clock analysis block 515, and alarm generation circuitry 520 correspond to the input interface 15, clock dividers 20, clock analysis block 40 and alarm generation circuitry 60 of FIG. 1. These components are arranged to generate alarms in dependence on the up pulse of the monitored clock signals.

As shown in FIG. 11, the input clock signal received by the input interface 505 is inverted by the inverter 525, in order to produce an input to the replicated clock dividers 530. These can be constructed identically to the clock dividers 510, but due to the fact that they are driven from the inverted clock signal they can be used to generate monitored clock signals from which a width indication can be produced for the down pulse of the signals being monitored by the elements 510, 515, 520. In particular, the replicated clock analysis block 535 can be constructed identically to the clock analysis block 515, and so can monitor the up pulse of the signals provided to it. However, due to the inversion performed by the inverter 525, these will effectively correspond to the down pulse of the monitored clock signals being monitored by the components 515, 520. Accordingly, the width indications produced by the replicated clock analysis block 535 can then be analysed by the replicated alarm generation circuitry 540 in order to produce alarms in dependence on the down pulse of the monitored clock signals (which as mentioned earlier correspond to the up pulse of the monitored clock signal variants produced from the inverted input clock signal). Hence, by replication of the circuitry, both the up pulses and the down pulses can be separately monitored, meaning that any individual change in an edge caused by tampering can be detected.

Once such replicated circuitry has been provided, then it is also possible to implement a duty cycle alarm detection technique. In particular, the duty cycle alarm generation circuitry 550 can be provided, and can be arranged to receive the width indication from one analysis circuit from amongst the analysis circuits in the clock analysis block 515, and also to receive the corresponding width indication from the corresponding one replicated analysis circuit within the replicated clock analysis block 535. Based on these two width indications, the duty cycle alarm generation circuitry can determine an actual duty cycle, and can then generate a duty cycle alarm signal when that actual duty cycles differs from an expected duty cycle.

The techniques described herein provide a very efficient and reliable mechanism for detecting changes in individual edges of an input clock signal, and can be used to detect a wide variety of different clock disturbances. When duplicating the circuitry as discussed with reference to FIG. 11, the techniques can also be used to detect duty cycle variations. The required circuitry can be produced entirely using digital components if desired, and can be arranged to occupy a small area and consume relatively small power consumption. The described techniques are very simple and scalable in design, consisting of N very small, identical blocks. In one example implementation, it has been found that such techniques can detect any movement of +/−10% on any system clock edge. Further, such techniques can be used to detect a glitch of any width capable of changing the state of a flip-flop, and any changes to the clock are detected nearly instantaneously (within N system clock edges) and are absolute, rather than relative.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware, which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. An apparatus comprising:
an input interface to receive an input clock signal;
a plurality N of clock divider circuits, where each clock divider circuit is arranged to generate a corresponding monitored clock signal by dividing the input clock signal by N;
wherein each clock divider circuit is arranged, when generating a leading edge of each clock cycle of its corresponding monitored clock signal, to use a leading edge of a different clock cycle of the input clock signal to the clock cycle of the input clock signal used by any other of the clock divider circuits to generate the leading edge of each clock cycle of their corresponding monitored clock signals;
analysis circuitry provided in association with each clock divider circuit to produce a width indication for each clock cycle of the corresponding monitored clock signal; and
alarm generation circuitry to trigger an alarm signal when, for any of the monitored clock signals, a variation in the width indication is detected over multiple clock cycles of that monitored clock signal.

2. An apparatus as claimed in claim 1, wherein the width indication is indicative of a width of a chosen phase of each clock cycle of the corresponding monitored clock signal.

3. An apparatus as claimed in claim 1, further comprising:
oscillator circuitry to generate a reference clock signal;
wherein the analysis circuitry provided in association with each clock divider circuit comprises counter circuitry to produce, as the width indication for each clock cycle of the corresponding monitored clock signal, a count value indicating the number of clock cycles of the reference clock signal occurring within a chosen phase of that clock cycle.

4. An apparatus as claimed in claim 3, wherein the counter circuitry comprises a binary coded decimal counter.

5. An apparatus as claimed in claim 3, further comprising:
counter reset circuitry to reset the counter circuitry provided in association with each clock divider circuit every N clock cycles of the input clock signal.

6. An apparatus as claimed in claim 5, wherein, for each counter circuitry, the counter reset circuitry is arranged to control timing of assertion of the reset signal in dependence on timing of a leading edge of the clock cycles of the corresponding monitored clock signal generated by the associated clock divider circuit.

7. An apparatus as claimed in claim 1, wherein the analysis circuitry provided in association with each clock divider circuit comprises:
chain signals generation circuitry to generate, for each clock cycle of the corresponding monitored clock signal generated by the associated clock divider circuit, a set of chain signals encoding the width indication.

8. An apparatus as claimed in claim 7, wherein the chain signals generation circuitry comprises a chain of registers that is configured to receive the corresponding monitored clock signal generated by the associated clock divider circuit, and to generate the set of chain signals in dependence on the corresponding monitored clock signal.

9. An apparatus as claimed in claim 8, wherein:
the chain signals generation circuitry further comprises a chain of logic gates that is coupled to the chain of registers; and
the chain of logic gates are arranged to receive the corresponding monitored clock signal and to produce, for each register in the chain of registers, a delayed version of the monitored clock signal that is used to derive a reset signal applied to that register, where an amount of delay in the delayed version of the monitored clock signal is different for each register.

10. An apparatus as claimed in claim 9, wherein an output value of each register is initialised to a first value at a start of each clock cycle of the corresponding monitored clock signal, and transitions to a second value when the reset signal is received at that register; and
the set of chain signals comprises the output value of each register at the end of each clock cycle, and the width indication is provided by those chain signals at the second value.

11. An apparatus as claimed in claim 1, further comprising:
inverter circuitry to generate an inverted version of the input clock signal;
replicated versions of the N clock divider circuits, analysis circuitry and alarm generation circuitry, wherein the replicated versions of the N clock divider circuits are arranged to receive the inverted version of the input clock signal;
whereby, for each monitored clock signal, the width indication produced by the associated analysis circuitry is indicative of a width of a first phase of a clock cycle of that monitored clock signal, and the width indication produced by the replicated version of the associated analysis circuitry is indicative of a width of a second phase of the clock cycle of that monitored clock signal.

12. An apparatus as claimed in claim 11, further comprising:
duty cycle alarm generation circuitry arranged to receive a first width indication produced by the analysis circuitry for a chosen one of the clock divider circuits during a given clock cycle of the corresponding monitored clock signal, and to receive a second width indication produced by the replicated version of the analysis circuitry for the replicated version of the chosen one of the clock divider circuits during the given clock cycle, to determine a duty cycle indication from a comparison of the first and second width indications, and to generate a duty cycle alarm signal when the determined duty cycle differs from an expected duty cycle.

13. An apparatus as claimed in claim 11, wherein the first phase comprises an up pulse of the clock cycle and the second phase comprises a down pulse of the clock cycle.

14. A method of detecting irregularities in an input clock signal, comprising:

- employing a plurality N of clock divider circuits to generate N monitored clock signals, where each clock divider circuit generates its corresponding monitored clock signal by dividing the input clock signal by N;
- arranging each clock divider circuit, when generating a leading edge of each clock cycle of its corresponding monitored clock signal, to use a leading edge of a different clock cycle of the input clock signal to the clock cycle of the input clock signal used by any other of the clock divider circuits to generate the leading edge of each clock cycle of their corresponding monitored clock signals;
- producing, for each clock divider circuit, a width indication for each clock cycle of the corresponding monitored clock signal; and
- triggering an alarm signal when, for any of the monitored clock signals, a variation in the width indication is detected over multiple clock cycles of that monitored clock signal.

15. An apparatus comprising:

- input interface means for receiving an input clock signal;
- a plurality N of clock divider means, each clock divider means for generating a corresponding monitored clock signal by dividing the input clock signal by N;
- wherein each clock divider means is arranged, when generating a leading edge of each clock cycle of its corresponding monitored clock signal, to use a leading edge of a different clock cycle of the input clock signal to the clock cycle of the input clock signal used by any other of the clock divider circuits to generate the leading edge of each clock cycle of their corresponding monitored clock signals;
- analysis means provided in association with each clock divider circuit, for producing a width indication for each clock cycle of the corresponding monitored clock signal; and
- alarm generation means for triggering an alarm signal when, for any of the monitored clock signals, a variation in the width indication is detected over multiple clock cycles of that monitored clock signal.

\* \* \* \* \*